United States Patent
Pamley et al.

(10) Patent No.: US 9,798,370 B2
(45) Date of Patent: Oct. 24, 2017

(54) DYNAMIC MEMORY VOLTAGE SCALING FOR POWER MANAGEMENT

(75) Inventors: Marc R. Pamley, Durham, NC (US); Jose M. Orro, Cary, NC (US); William F. Keown, Jr., Raleigh, NC (US); Albert V. Makley, Morrisville, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 362 days.

(21) Appl. No.: 12/414,248

(22) Filed: Mar. 30, 2009

(65) Prior Publication Data

US 2010/0250981 A1    Sep. 30, 2010

(51) Int. Cl.
   *G06F 1/00*     (2006.01)
   *G06F 1/26*     (2006.01)
   *G06F 1/32*     (2006.01)
   *G11C 11/4074*  (2006.01)

(52) U.S. Cl.
   CPC .......... *G06F 1/3203* (2013.01); *G06F 1/3275* (2013.01); *G06F 1/3296* (2013.01); *G11C 11/4074* (2013.01); *Y02B 60/1217* (2013.01); *Y02B 60/1228* (2013.01); *Y02B 60/1285* (2013.01); *Y02B 60/32* (2013.01)

(58) Field of Classification Search
   CPC .... G06F 1/3203; G06F 1/3225; G06F 1/3275; Y02B 60/1217; Y02B 60/1285
   USPC ......................................... 713/300, 320, 324
   See application file for complete search history.

(56) References Cited

U.S. PATENT DOCUMENTS

| | | | | |
|---|---|---|---|---|
| 6,327,664 | B1 * | 12/2001 | Dell et al. | 713/323 |
| 6,657,634 | B1 * | 12/2003 | Sinclair et al. | 345/534 |
| 6,820,209 | B1 * | 11/2004 | Culbert | G06F 1/3203 345/520 |
| 7,437,579 | B2 * | 10/2008 | Jeddeloh et al. | 713/300 |
| 7,483,329 | B2 * | 1/2009 | Luo et al. | 365/226 |
| 7,788,513 | B2 * | 8/2010 | Vaden et al. | 713/320 |
| 2003/0065960 | A1 * | 4/2003 | Rusu | G06F 1/3203 713/300 |
| 2003/0101362 | A1 * | 5/2003 | Dia | G06F 1/3203 713/300 |
| 2003/0120962 | A1 * | 6/2003 | Dai | G06F 1/3203 713/320 |
| 2004/0174763 | A1 * | 9/2004 | Schnepper | G06F 1/26 365/226 |

(Continued)

OTHER PUBLICATIONS

David et al., "Memory Power Management via Dynamic Voltage/Frequency Scaling", Intel, Safari, Carnegie Mellon, Dec. 15, 2003, pp. 1-43.*

(Continued)

*Primary Examiner* — Faisal M Zaman
(74) *Attorney, Agent, or Firm* — Ference & Associates LLC

(57) ABSTRACT

In the context of computer systems, the present invention broadly contemplates the ability to dynamically adjust the voltage and frequency of DRAM memory modules that are dual-voltage tolerant based on system performance. The invention allows a computer system to dynamically scale the memory voltage between a lower and a higher voltage, thereby allowing the system to save power when the system is idle or in low usage, but also allowing the system to realize the full memory performance when running more intensive applications.

20 Claims, 4 Drawing Sheets

(56) References Cited

U.S. PATENT DOCUMENTS

| | | | | |
|---|---|---|---|---|
| 2004/0215986 | A1* | 10/2004 | Shakkarwar | G06F 1/3296 713/300 |
| 2005/0094036 | A1* | 5/2005 | Tichelaar | G06F 1/3293 348/730 |
| 2005/0132238 | A1* | 6/2005 | Nanja | G06F 1/3203 713/300 |
| 2005/0146973 | A1* | 7/2005 | Schoenfeld | 365/227 |
| 2005/0237823 | A1* | 10/2005 | Aitken et al. | 365/189.09 |
| 2006/0117160 | A1* | 6/2006 | Jackson | G06F 1/3203 711/170 |
| 2006/0123253 | A1* | 6/2006 | Morgan | G06F 1/3228 713/300 |
| 2006/0174151 | A1* | 8/2006 | Lin | G06F 1/3203 713/500 |
| 2006/0187226 | A1* | 8/2006 | Bruno | G06F 1/3203 345/534 |
| 2006/0214009 | A1* | 9/2006 | Shikata et al. | 235/492 |
| 2007/0174642 | A1* | 7/2007 | Cornwell et al. | 713/300 |
| 2008/0049510 | A1* | 2/2008 | Chen et al. | 365/185.18 |
| 2008/0080254 | A1* | 4/2008 | Kagan et al. | 365/185.23 |
| 2008/0162951 | A1* | 7/2008 | Kenkare | G06F 1/3225 713/300 |
| 2008/0195876 | A1* | 8/2008 | Priel | G06F 1/32 713/320 |
| 2008/0222436 | A1* | 9/2008 | Matsui | 713/320 |
| 2008/0313482 | A1* | 12/2008 | Karlapalem et al. | 713/324 |
| 2009/0031155 | A1* | 1/2009 | Hofmann | G06F 1/3203 713/321 |
| 2009/0125667 | A1* | 5/2009 | Hatasaki | G11O 5/144 711/6 |
| 2009/0141569 | A1* | 6/2009 | Nii et al. | 365/189.16 |
| 2009/0172427 | A1* | 7/2009 | Lin | G06F 1/3234 713/300 |
| 2009/0210654 | A1* | 8/2009 | Koul | G06F 1/3203 712/25 |
| 2010/0037073 | A1* | 2/2010 | Huizenga et al. | 713/320 |
| 2010/0095137 | A1* | 4/2010 | Bieswanger | G06F 1/3203 713/300 |
| 2010/0138684 | A1* | 6/2010 | Kim | G06F 1/3225 713/601 |
| 2010/0264753 | A1* | 10/2010 | Toyama | G06F 1/26 307/130 |

OTHER PUBLICATIONS

Kingston Technology, Kingston Tools, Ultimate Memory Guide.

* cited by examiner

DYNAMIC MEMORY VOLTAGE SCALING FOR POWER MANAGEMENT

FIELD OF THE INVENTION

The present invention relates generally to methods and arrangements for power saving techniques, and more particularly to a technique that can be effectively applied for power saving in systems supporting dual voltage memory.

BACKGROUND OF THE INVENTION

Electronic devices such as computer systems consume a great deal of power. Computer systems include but are not limited to a desktop personal computer (PC), a laptop PC, a server, or a workstation. All computer systems can benefit from the implementation of power-saving techniques.

Computer manufacturers have been the latest industry to jump onto the "Green" design trend. Computer manufacturers are investigating the energy consumption of everything in a computer system, including memory. Accordingly, memories are being produced that operate on lower voltages and thus consume less power.

Computer systems use a variety of different forms of memory to store data both in the short-term and the long-term. Some useful background information on computer system memory generally is found in Kingston® Technology's *Ultimate Memory Guide*, available at: http://www.kingston.com/tools/umg/Default.asp, incorporated by reference herein.

Dynamic Random Access Memory (DRAM) is a common type of RAM used in computer systems today. Memory vendors are starting to release DRAMs that are both high and low voltage tolerant with a view towards energy savings. DRAMs running at the higher voltage will be higher performing but will also consume more power. Conversely, DRAMs running at the lower voltage will offer power savings but result in reduced performance. Today, computer systems must run at either the higher voltage or the lower voltage, but not both.

Accordingly, a need has been recognized in connection with affording computer systems capable of utilizing both the high and low voltage capabilities of currently produced memories such that power can be saved without negatively impacting system performance.

SUMMARY OF THE INVENTION

Generally, there is broadly contemplated herein, in accordance with at least one presently preferred embodiment of the invention, a computer system that dynamically scales memory voltage based on system performance. The invention allows a computer system to dynamically scale the memory voltage, thereby allowing the system to save power when the system is idle or in low usage, but while also allowing the system to realize the full memory performance when running more intensive applications.

In summary, one aspect of the invention provides a method comprising: monitoring system usage; setting at least one memory module to a lower voltage when system usage drops below a predetermined amount; and setting the at least one memory module to a higher voltage when system usage exceeds the predetermined amount.

Another aspect of the present invention provides an apparatus comprising: at least one processor; and a tangible program storage device embodying a program of instructions that when executed by the at least one processor to enable the apparatus to: monitor system usage; set at least one memory module to a lower voltage when system usage drops below a predetermined amount; and set the at least one memory module to a higher voltage when system usage exceeds the predetermined amount.

A further aspect of the invention provides a program storage device readable by machine, tangibly embodying a program of instructions that when executed by at least one processor of the machine enable the machine to: monitor system usage; set at least one memory module to a lower voltage when system usage drops below a predetermined usage amount; and set the at least one memory module to a higher voltage when system usage exceeds the predetermined usage amount.

For a better understanding of the present invention, together with other and further features and advantages thereof, reference is made to the following description, taken in conjunction with the accompanying drawings, and the scope of the invention will be pointed out in the appended claims.

DETAILED DESCRIPTION OF THE PREFERRED EMBODIMENTS

Figure 1:
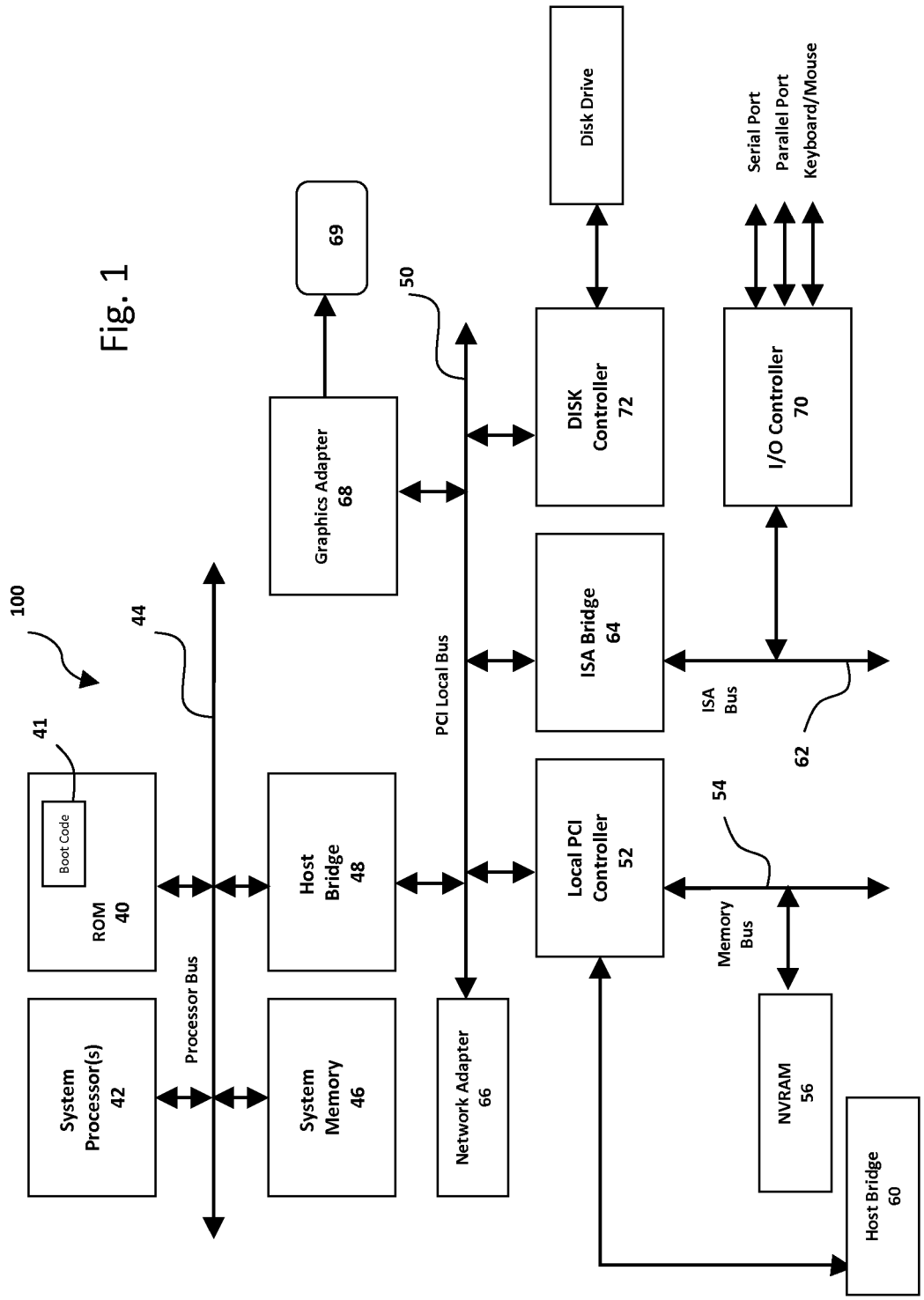
FIG. 1 schematically illustrates a block diagram of a computer system.

It will be readily understood that the components of the present invention, as generally described and illustrated in the figures herein, may be arranged and designed in a wide variety of different configurations in addition to the described presently preferred embodiments. Thus, the following more detailed description of the embodiments of the present invention, as represented in the figures, is not intended to limit the scope of the invention, as claimed, but is merely representative of selected presently preferred embodiments of the invention.

Reference throughout this specification to "one embodiment" or "an embodiment" (or the like) means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings. The following description is intended only by way of example, and simply illustrates certain selected presently preferred embodiments of the invention as claimed herein.

The present invention, according to at least one presently preferred embodiment, allows the computer to dynamically scale the memory voltage between a lower and a higher voltage, thereby allowing the user to save power when the system is idle or in low usage, but also allowing the user to realize the full memory performance when running more intensive applications.

As alluded to above, memory vendors are starting to release DRAMs that are dual-voltage tolerant, for example 1.35 volt and 1.5 volt tolerant. DRAMs running at 1.5V will be higher performing but will also consume more power. Today, a workstation user must run at either 1.35V or 1.5V, but not both. The present invention, according to at least one presently preferred embodiment, allows the computer to dynamically scale the memory voltage between a higher and a lower voltage (e.g., 1.35V and 1.5V) for optimal system performance matched to a specific usage context.

The inherent design limitation in the currently produced dual-voltage DRAMs is that while the DRAM is running at 1.35V it will also run at one frequency bin slower than while operating at 1.5V (e.g. DRAMs running at 1333 MHz at 1.5V will run at 1066 MHz at 1.35V). This is being dictated by the memory industry, as the silicon is not capable of performing at the faster frequency while operating at the lower voltage. The present invention, in a preferred embodiment, capitalizes on this design limitation by dynamically adjusting the voltage and frequency based on system performance.

Referring now to FIG. 1, there is depicted a block diagram of an illustrative embodiment of a computer system 100. The illustrative embodiment depicted in FIG. 1 may be a notebook computer system, such as one of the ThinkPad® series of personal computers sold by Lenovo (US) Inc. of Morrisville, N.C. or a workstation computer, such as the Thinkstation®, which is also sold by Lenovo (US) Inc. of Morrisville, N.C. As is apparent from the description, however, the present invention is applicable to any data processing system or other electronic device supporting dual voltage memory, as described herein. A preferred implementation is in connection with a workstation computer.

As shown in FIG. 1, computer system 100 includes at least one system processor 42, which is coupled to a Read-Only Memory (ROM) 40 and a system memory 46 by a processor bus 44. System processor 42, which may comprise one of the processors produced by AMD Corporation or a processor produced by Intel Corporation, is a general-purpose processor that executes boot code 41 stored within ROM 40 at power-on and thereafter processes data under the control of operating system and application software stored in system memory 46. System processor 42 is coupled via processor bus 44 and host bridge 48 to Peripheral Component Interconnect (PCI) local bus 50.

PCI local bus 50 supports the attachment of a number of devices, including adapters and bridges. Among these devices is network adapter 66, which interfaces computer system 100 to LAN 10, and graphics adapter 68, which interfaces computer system 100 to display 69. Communication on PCI local bus 50 is governed by local PCI controller 52, which is in turn coupled to non-volatile random access memory (NVRAM) 56 via memory bus 54. Local PCI controller 52 can be coupled to additional buses and devices via a second host bridge 60.

Computer system 100 further includes Industry Standard Architecture (ISA) bus 62, which is coupled to PCI local bus 50 by ISA bridge 64. Coupled to ISA bus 62 is an input/output (I/O) controller 70, which controls communication between computer system 100 and attached peripheral devices such as a keyboard, mouse, and a disk drive. In addition, I/O controller 70 supports external communication by computer system 100 via serial and parallel ports (e.g. to a keyboard as herein described, the keyboard being operatively coupled to the components of the system to enable a user to execute the functionality of the system). The USB Bus and USB Controller (not shown) are part of the Local PCI controller (52).

Figure 2:
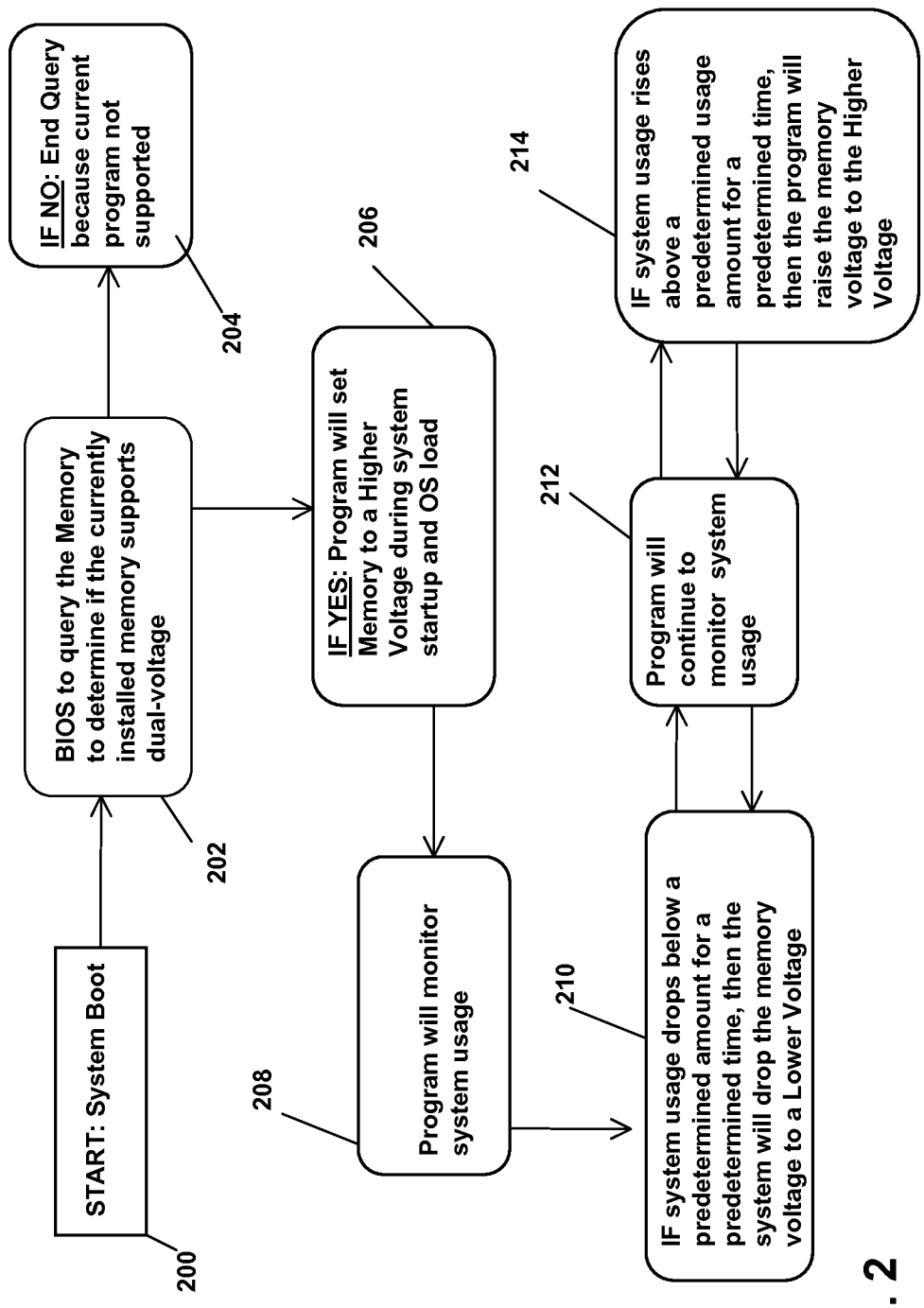
FIG. 2 illustrates a method of dynamic memory voltage scaling.

FIG. 2 schematically illustrates a non-limiting and exemplary method of dynamic voltage scaling according to at least one embodiment of the invention. At system boot (200), BIOS will query the memory (e.g., through serial presence detect (SPD) information) to determine if the currently installed memory modules support dual voltage usage (202) (e.g., if dual voltage 1.35V and 1.5V DRAM is present). If so, the system's dynamic memory scaling can be applied. If not, the program will end because the currently installed memory is does not support dual voltage and scaling between the voltages cannot take place (204).

If dual-voltage capable, memory will be set to a higher voltage during boot and loading of the operating system (OS) (206) (e.g., 1.5V utilized). Thereafter (e.g. during runtime) the program will monitor system activity (208). For example, if the central processing unit (CPU) is shown as idle or with low usage (usage level configurable—e.g. a percentage of CPU usage) for a predetermined time (time configurable—e.g. two minutes), the program will implement the memory voltage/frequency drop sequence (210) (described further in connection with FIG. 3 below). This allows the voltage of the DRAM to be switched to the lower voltage (e.g. 1.35V).

Following the implementation of the memory voltage/frequency drop sequence, the program will continue to monitor system activity (212), and when the user initializes an application or sustained activity greater than the predetermined threshold and time (both configurable), the memory module will be returned to the higher voltage operation. This switching is similar to the process described above, e.g. by implementing the memory voltage/frequency raising sequence (214) (describe further in connection with FIG. 4 below). The program thus continues to monitor system activity/usage and the dynamic voltage scaling accordingly.

The present invention thus contemplates that the predetermined usage level (threshold level) that triggers dynamic voltage scaling is configurable. In a preferred embodiment, the usage-level threshold (and time) is preset between 10-20% of system activity for a period of 1-2 minutes, respectively. For example, if system activity falls below 20% usage for more than two minutes, the present invention would automatically implement the memory voltage/frequency drop in order to conserve power because increased performance is not required by the system. The application program will allow the user to configure these parameters (system usage and time) such that the system performs dynamic voltage scaling as desired.

Figure 3:
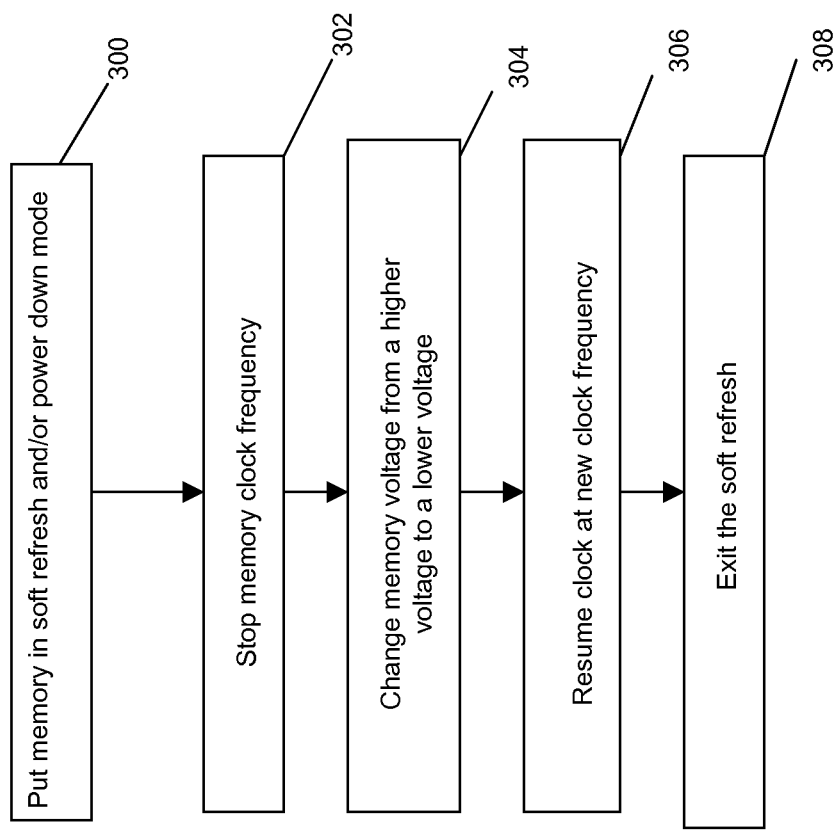
FIG. 3 illustrates a method of memory voltage/frequency droping.

FIG. 3 illustrates a non-limiting and exemplary method for a memory voltage/frequency drop procedure according to a preferred embodiment of the present invention. Following a determination that the memory should be dropped to the lower voltage as per the method outlined in connection with FIG. 2, the program will first issue a command to put the memory module in a soft refresh and/or power down mode (300). The program then stops the memory clock frequency (302). Next, the program will change the memory module voltage from the higher voltage to a lower voltage (304) (e.g., from 1.5V to 1.35V). Then the program resumes the clock at a new frequency (306) but at 1 factor lower than the previous frequency (e.g. if memory was running at 1333 MHz, clock will now be set at 1066 MHz). The program will exit the memory soft refresh, which will synchronize back the delay-locked loop (DLL) clock in the Dynamic Random Access Memory (DRAM) (308). It should be understood that, depending on the system implementation chosen, the DRAMs could be any of a wide variety, including for example unbuffered dual in-line memory modules (UDIMMs) or registered DIMMs (RDIMMs).

Figure 4:
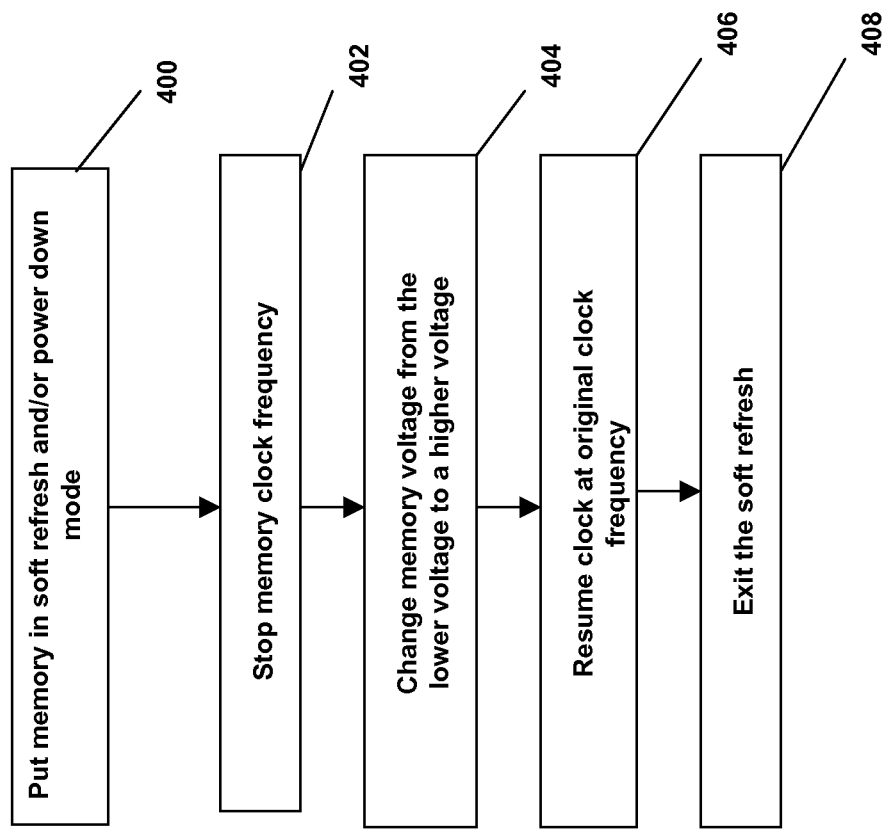
FIG. 4 illustrates a method of memory voltage/frequency raising.

FIG. 4 illustrates a non-limiting and exemplary method for memory voltage/frequency raising according to a preferred embodiment of the present invention. Following a determination that the memory should be raised to a higher voltage as per the method outlined in connection with FIG. 2, the program will first issue the command to put the memory module in a soft refresh and/or power down mode (400). Next the program stops the memory clock frequency (402). Next, the program will change the memory module voltage from the lower voltage to the higher voltage setting (404) (e.g., from 1.35V to 1.5V). Next, the program will resume the clock at the original clock frequency setting (406) (e.g. if memory is running at 1066 MHz, return it to 1333 MHz), followed by an exit of the soft refresh, which will synchronize back the DLL clock in the DRAM(s) (408).

It is presently preferred that the entire voltage/frequency change process should be transparent to the end user. The total process time should only be a few microseconds, which consists of the memory clock stop/sync time and time for voltage transition (scaling). All of the hardware to support this implementation exists in the most recent workstation designs of the present invention. Some firmware/software updates may need to be created and validated as new dual-voltage memory modules become available, as is known by those having ordinary skill in the art. Again, the present invention further contemplates the use of a user-customizable interface (e.g. running within the operating system) for adjusting the program's various thresholds as needed.

Although the present invention uses the example of a DRAM throughout this description that operates at dual voltage settings of both 1.5V and 1.35V, it is noted that this is only an illustrative example.

In summary, the present invention broadly contemplates in at least one presently preferred embodiment a computer system configured to dynamically scale the voltage and frequency of memory (DRAMs) with dual-voltage support, based on system usage. The invention thus allows a computer system to dynamically scale the memory voltage between for example, 1.5V and 1.35V, thereby allowing the user to save power when the system is idle or in low usage, but also allowing the user to realize the full memory performance when running more intensive applications (e.g. by raising the voltage). A particularly preferred implementation for this invention is in conjunction with a workstation computer, as workstation computers run processor intensive applications requiring high performance yet can experience significant idle time during which power savings can be had.

Many of the functional characteristics of the inventive system described in this specification may be implemented as modules. Modules may include hardware circuits such as one or more processors with memory, programmable logic, and/or discrete components. The hardware circuits may perform hardwired logic functions, execute computer readable programs stored on tangible storage devices, and/or execute programmed functions. The computer readable programs may in combination with a computer system and the other described elements perform the functions of the invention.

It will be readily understood by those having ordinary skill in the art that embodiments of the present invention may take the form of an entirely hardware embodiment or an embodiment containing both hardware and software elements. An embodiment that is implemented in software may include, but is not limited to, firmware, resident software, microcode, etc.

The computer readable programs may be stored in tangible computer/machine-readable (apparatus readable) medium. Examples of a computer/machine-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Accordingly, elements of the present invention may be implemented on at least one computer running suitable software programs. These may also be implemented on at least one Integrated Circuit or part of at least one Integrated Circuit. Thus, it is to be understood that the invention may be implemented in a combination of both hardware and software. Again, computer/machine-readable programs may in combination with a computer system perform the functions of the invention.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure for various embodiments with various modifications as are suited to the particular use contemplated.

In the drawings and specification there has been set forth a preferred embodiment of the invention and, although specific terms are used, the description thus given uses terminology in a generic and descriptive sense only and not for purposes of limitation.

If not otherwise stated herein, it is to be assumed that all patents, patent applications, patent publications and other publications (including web-based publications) mentioned and cited herein are hereby fully incorporated by reference herein as if set forth in their entirety.

What is claimed is:

1. A method comprising:
   monitoring current central processing unit usage;
   setting at least one memory module to a lower operating voltage supported by the memory module, having a first frequency of operation, responsive to the current central processing unit usage dropping below a predetermined amount, wherein the setting at least one memory module to a lower operating voltage comprises stopping the memory clock frequency and changing the voltage of the at least one memory module to the lower operating voltage; and
   setting the at least one memory module to a higher operating voltage supported by the memory module, having a second frequency of operation, other than the first frequency, responsive to the current central processing unit usage exceeding the predetermined amount, wherein the setting at least one memory module to a higher operating voltage comprises stopping the memory clock frequency and changing the voltage of the at least one memory module to the higher operating voltage.

2. The method according to claim 1, further comprising:
querying the at least one memory module to determine if the memory module supports dual-voltage usage; and
setting the at least one memory module to the higher operating voltage during a system boot and operating system load;
wherein said at least one memory module comprises a dual voltage random access memory.

3. The method according to claim 1, wherein the monitoring central processing unit usage comprises monitoring usage percentage of a central processing unit.

4. The method according to claim 1, wherein:
the setting the at least one memory module to the higher operating voltage occurs if the central processing unit usage exceeds the predetermined amount for a first predetermined time; and
the setting the at least one memory module to the lower operating voltage occurs if the central processing unit drops below the predetermined amount for a second predetermined time.

5. The method according to claim 1, wherein the setting the at least one memory module to a lower operating voltage further comprises:
putting the at least one memory module into a soft refresh and/or power down mode;
stopping a memory clock frequency;
issuing a command to change a voltage of the at least one memory module from the higher operating voltage to the lower operating voltage;
resuming the memory clock at a new clock frequency; and
exiting the soft refresh.

6. The method according to claim 1, wherein the setting the at least one memory module to a higher operating voltage further comprises:
putting the at least one memory module into a soft refresh and/or power down mode;
stopping a memory clock frequency;
issuing a command to change a voltage of the at least one memory from the lower operating voltage to the higher voltage;
resuming the memory clock at original clock frequency; and
exiting the soft refresh.

7. The method according to claim 1, wherein the predetermined usage amount is twenty percent.

8. The method according to claim 4, wherein the second predetermined period of time is between one and two minutes.

9. The method according to claim 1, wherein:
the higher operating voltage is 1.5 volts; and
the lower operating voltage is 1.35 volts.

10. An apparatus comprising:
at least one processor; and
a program storage device embodying a program of instructions that are executed by the at least one processor enable the apparatus to:
monitor central processing unit usage;
set at least one memory module to a lower operating voltage supported by the memory module, having a first frequency of operation, responsive to the current central processing unit usage dropping below a predetermined amount, wherein to set at least one memory module to a lower operating voltage comprises stopping the memory clock frequency and changing the voltage of the at least one memory module to the lower operating voltage; and
set the at least one memory module to a higher operating voltage supported by the memory module, having second frequency of operation, other than the first frequency, responsive to the current central processing unit usage exceeding the predetermined amount, wherein to set at least one memory module to a higher operating voltage comprises stopping the memory clock frequency and changing the voltage of the at least one memory module to the higher operating voltage.

11. The apparatus according to claim 10, wherein the program of instructions further enable the apparatus to:
query the at least one memory module to determine if the memory module supports dual-voltage usage; and
set the at least one memory module to the higher operating voltage during a system boot and operating system load;
wherein said at least one memory module comprises a dual voltage random access memory.

12. The apparatus according to claim 10, wherein to monitor central processing unit usage comprises monitoring usage percentage of a central processing unit.

13. The apparatus according to claim 10, wherein the program of instructions enables the apparatus to set the at least one memory module to the higher operating voltage if the central processing unit usage exceeds the predetermined amount for a first predetermined time; and
set the at least one memory module to the lower operating voltage if the central processing unit usage drops below the predetermined amount for a second predetermined time.

14. The apparatus according to claim 10, wherein to set the at least one memory module to a lower operating voltage further comprises:
putting the at least one memory module into a soft refresh and/or power down mode;
stopping a memory clock frequency;
issuing a command to change a voltage of the at least one memory module from the higher operating voltage to the lower operating voltage;
resuming the memory clock at a new clock frequency; and
exiting the soft refresh.

15. The apparatus according to claim 10, wherein to set the at least one memory module to a higher operating voltage further comprises:
putting the at least one memory module into a soft refresh and/or power down mode;
stopping a memory clock frequency;
issuing a command to change a voltage of the at least one memory from the lower operating voltage to the higher operating voltage;
resuming the memory clock at original clock frequency; and
exiting the soft refresh.

16. The apparatus according to claim 10, wherein the predetermined usage amount is twenty percent.

17. The apparatus according to claim 13, wherein the second predetermined period of time is between one and two minutes.

18. The apparatus according to claim 10, wherein:
the higher operating voltage is 1.5 volts; and
the lower operating voltage is 1.35 volts.

19. A program storage device readable by machine, embodying a program of instructions that when executed by at least one processor of the machine, the program of instructions comprising:
    code that monitors central processing unit usage;
    code that sets at least one memory module to a lower operating voltage supported by the memory module, having a first frequency of operation, responsive to the current central processing unit usage dropping below a predetermined usage amount, wherein the code that sets at least one memory module to a lower operating voltage comprises stopping the memory clock frequency and changing the voltage of the at least one memory module to the lower operating voltage; and
    set the at least one memory module to a higher operating voltage supported by the memory module, having second frequency of operation, other than the first frequency, responsive to the current central processing unit usage exceeding the predetermined usage amount, wherein the code that sets at least one memory module to a higher operating voltage comprises stopping the memory clock frequency and changing the voltage of the at least one memory module to the higher operating voltage.

20. The program storage device according to claim 19, wherein:
    the higher operating voltage is 1.5 volts; and
    the lower operating voltage is 1.35 volts.

\* \* \* \* \*